(12) United States Patent
Daugherty et al.

(10) Patent No.: US 9,580,360 B2
(45) Date of Patent: Feb. 28, 2017

(54) MONOLITHIC CERAMIC COMPONENT OF GAS DELIVERY SYSTEM AND METHOD OF MAKING AND USE THEREOF

(71) Applicant: Lam Research Corporation, Fremont, CA (US)

(72) Inventors: John Daugherty, Fremont, CA (US); Iqbal Shareef, Fremont, CA (US); Mike Ingamells, Danville, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/676,180

(22) Filed: Apr. 1, 2015

(65) Prior Publication Data

US 2015/0287572 A1    Oct. 8, 2015

Related U.S. Application Data

(60) Provisional application No. 61/976,295, filed on Apr. 7, 2014.

(51) Int. Cl.

| C04B 35/622 | (2006.01) |
| H01J 37/32 | (2006.01) |
| C04B 35/66 | (2006.01) |
| C04B 35/64 | (2006.01) |
| B28B 1/00 | (2006.01) |
| B32B 18/00 | (2006.01) |

(Continued)

(52) U.S. Cl.
CPC ............ *C04B 35/622* (2013.01); *B28B 1/001* (2013.01); *B32B 18/00* (2013.01); *C04B 35/00* (2013.01); *C04B 35/64* (2013.01); *C04B 35/66* (2013.01); *H01J 37/3244* (2013.01); *B33Y 10/00* (2014.12); *B33Y 30/00* (2014.12); *C23C 16/45561* (2013.01); *C23C 16/45563* (2013.01)

(58) Field of Classification Search
None
See application file for complete search history.

(56) References Cited

U.S. PATENT DOCUMENTS 6,527,890 B1 * 3/2003 Huang ............... F04B 19/006
                                                    156/89.11
6,596,224 B1 * 7/2003 Sachs .................... B22F 3/008
                                                    264/113

(Continued)

OTHER PUBLICATIONS

Kingery, W. D. et al., "Introduction to Ceramics", $2^{nd}$ Edition, J. Wiley & Sons, 1976.

*Primary Examiner* — Jiong-Ping Lu

(57) ABSTRACT

A method of making a monolithic ceramic component of a gas delivery system of a semiconductor substrate processing apparatus wherein the gas delivery system is configured to supply process gas to a gas distribution member disposed downstream thereof. The gas distribution member is configured to supply the process gas to a processing region of a vacuum chamber of the apparatus, wherein the processing region is disposed above an upper surface of a semiconductor substrate to be processed. The method comprises preparing a green compact of ceramic material. The green compact of ceramic material is formed into a form of a desired monolithic ceramic component of the gas delivery system. The formed green compact of ceramic material is fired to form the monolithic ceramic component of the gas delivery system.

9 Claims, 3 Drawing Sheets

(51) Int. Cl.
 *C04B 35/00* (2006.01)
 *C23C 16/455* (2006.01)
 *B33Y 10/00* (2015.01)
 *B33Y 30/00* (2015.01)

(56) References Cited

U.S. PATENT DOCUMENTS

| | | | |
|---|---|---|---|
| 6,780,787 B2* | 8/2004 | O'Donnell | C23C 4/02 |
| | | | 118/719 |
| 7,234,222 B1 | 6/2007 | Hao et al. | |
| 8,122,910 B2 | 2/2012 | Taskar | |
| 8,318,327 B2 | 11/2012 | O'Donnell | |
| 8,322,380 B2 | 12/2012 | Taskar | |
| 8,340,827 B2 | 12/2012 | Yun et al. | |
| 8,521,461 B2 | 8/2013 | Shareef et al. | |
| 8,587,113 B2 | 11/2013 | Gaff et al. | |
| 8,622,021 B2 | 1/2014 | Taylor et al. | |
| 8,794,267 B2 | 8/2014 | Shareef et al. | |
| 8,883,029 B2 | 11/2014 | Taylor | |
| 2009/0324999 A1* | 12/2009 | Devoe | H01M 8/0202 |
| | | | 429/469 |
| 2012/0237696 A1 | 9/2012 | Huseinovic et al. | |
| 2013/0059071 A1 | 3/2013 | O'Donnell | |
| 2014/0076236 A1 | 3/2014 | Sankarakrishnan et al. | |

\* cited by examiner

ND METHOD OF
MONOLITHIC CERAMIC COMPONENT OF GAS DELIVERY SYSTEM AND METHOD OF MAKING AND USE THEREOF

CROSS REFERENCE TO RELATED APPLICATION

This application claims priority under 35 U.S.C. §119(e) to U.S. Provisional Application No. 61/976,295, filed on Apr. 7, 2014, the entire content of which is incorporated herein by reference thereto.

FIELD OF THE INVENTION

The invention relates to semiconductor substrate processing apparatuses and more specifically to gas delivery systems and methods of making gas delivery systems for delivering process gas to a vacuum chamber of the semiconductor substrate processing apparatus.

BACKGROUND

Semiconductor substrate processing apparatuses are used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, and resist removal. Semiconductor substrate processing apparatuses include gas delivery systems through which process gas is flowed and subsequently delivered into a processing region of a vacuum chamber of the apparatus by a gas distribution member such as a showerhead, gas injector, gas ring, or the like. For example, the gas delivery system can be configured to supply process gas to a gas injector positioned in the chamber above a semiconductor substrate so as to distribute process gas over a surface of the semiconductor substrate being processed in the chamber. Current gas delivery systems are constructed from many individual components, many of which have conduits therein through which process gas flows. The individual component interfaces require seals therebetween such that leaking does not occur when process gas is being supplied through the conduits of the assembled gas delivery system. Furthermore, many components of gas delivery system are formed from metal, such as stainless steel, wherein metal contaminants can be released from the process gas wetted surfaces forming the conduits of the component by corrosion, erosion and/or corrosion/erosion which may lead to contamination of semiconductor substrates during processing thereof. Thus, there is a need for gas delivery systems which comprise fewer individual components, and further, it is desired that the components thereof are corrosion, erosion, and corrosion/erosion resistant.

SUMMARY

Disclosed herein is a method of making a monolithic ceramic component of a gas delivery system of a semiconductor substrate processing apparatus wherein the gas delivery system is configured to supply process gas to a gas distribution member disposed downstream thereof. The gas distribution member is configured to supply the process gas to a processing region of a vacuum chamber of the apparatus, wherein the processing region is disposed above an upper surface of a semiconductor substrate to be processed. The method comprises preparing a green compact of ceramic material. The green compact of ceramic material is formed into a form of a desired monolithic ceramic component of the gas delivery system. The formed green compact of ceramic material is fired to form the monolithic ceramic component of the gas delivery system.

Also disclosed herein is a method of making a monolithic ceramic component of a gas delivery system of a semiconductor substrate processing apparatus wherein the gas delivery system is configured to supply process gas to a gas distribution member disposed downstream thereof. The gas distribution member is configured to supply the process gas to a processing region of a vacuum chamber of the apparatus, wherein the processing region is disposed above an upper surface of a semiconductor substrate to be processed. The method comprises preparing layers of a green compact of ceramic material. The layers of the green compact of ceramic material are over layered, layer by layer, to form a green compact of ceramic material which corresponds to a form of a desired monolithic ceramic component of the gas delivery system. Each layer of the green compact of ceramic material is patterned such that one or more vertical, diagonal, and/or horizontal conduits are formed in the formed green compact of ceramic material for supplying process gas therethrough, and one or more inlet ports and one or more outlet ports are formed in the formed green compact of ceramic material. The formed green compact of ceramic material is fired to form the monolithic ceramic component of the gas delivery system.

BRIEF DESCRIPTION OF THE DRAWING FIGURES

DETAILED DESCRIPTION

Figure 1:
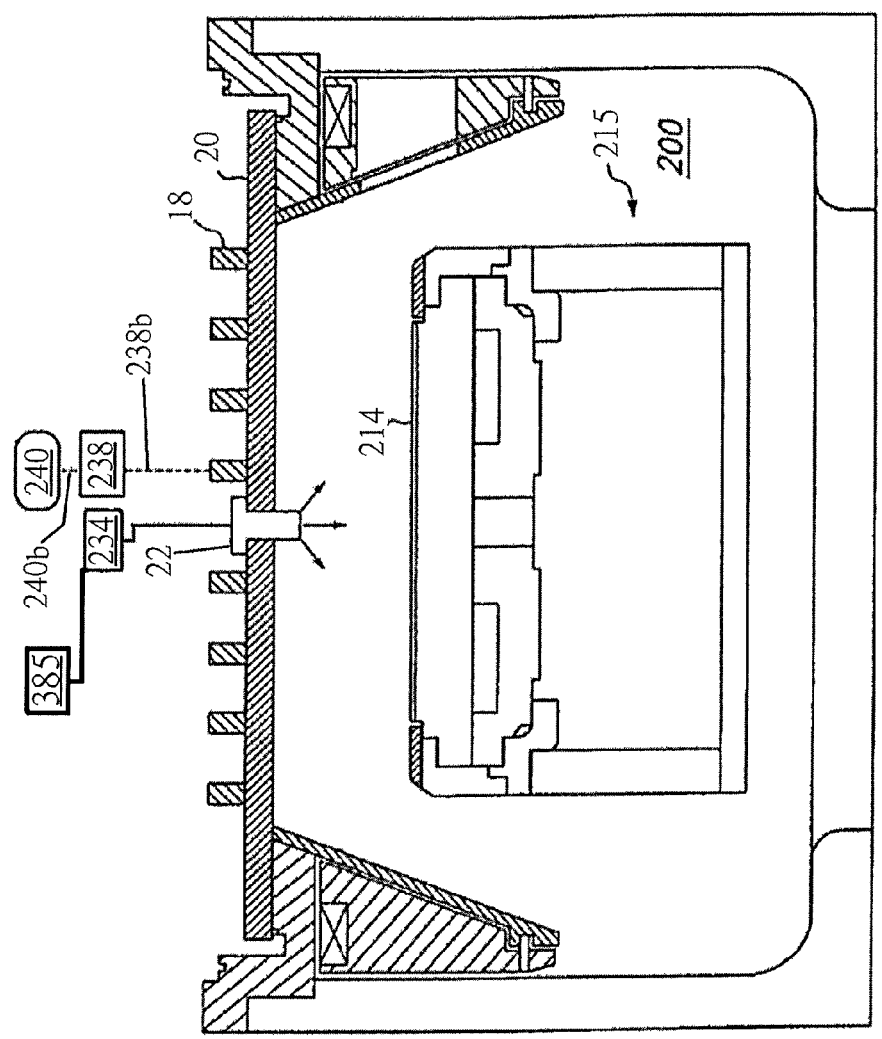
FIG. 1 illustrates an embodiment of a semiconductor substrate processing apparatus in accordance with embodiments disclosed herein.

Disclosed herein is a monolithic ceramic component of a gas delivery system of a semiconductor substrate processing apparatus and a method of making a monolithic ceramic component of a gas delivery system wherein the monolithic ceramic component is corrosion, erosion, and corrosion/erosion resistant such that metal contamination of a semiconductor substrate is reduced during processing of the semiconductor substrate. The semiconductor substrate processing apparatus can be used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, or resist removal. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

Thus, control of particulate contamination on the surfaces of semiconductor substrates during the fabrication of integrated circuits thereon is useful in achieving reliable devices and obtaining a high yield. Processing equipment, such as gas delivery systems of semiconductor substrate processing apparatuses, can be a source of particulate contamination, when process gas wetted metallic surfaces of components of gas delivery systems are corroded and/or eroded. Examples of metallic contamination include, but are not limited to, particulates having material including aluminum, barium, calcium, cerium, chromium, copper, gallium, indium, iron, lithium, magnesium, nickel, potassium, sodium, strontium, tin, titanium, vanadium, yttrium, zinc, zirconium and/or combinations thereof.

Gas distribution systems of semiconductor substrate processing apparatuses can utilize gas sticks which are a series of gas distribution and control components such as a mass flow controller, one or more pressure transducers and/or regulators, a heater, one or more filters or purifiers, manifolds, gas flow adaptors, and shutoff valves. The components used and their particular arrangement in a gas stick can vary depending upon their design and application, with many component arrangements being known in the art. For example, in a semiconductor substrate processing arrangement, over seventeen process gases can be supplied to the chamber via gas supply lines, and gas distribution system components. The gas distribution system components are attached to a base plate (i.e. gas pallet) forming the system which is also known as a "gas panel" or "gas box".

As explained above, in semiconductor manufacturing, processes have become increasingly intolerant of particle contamination as the dimensions of semiconductor devices decrease and there is less room to accommodate more components. Sources for particle contamination can include metal components in the gas stick and the mixing manifold which delivers process gases from a source of high purity gases to the processing chamber where such particle contaminants commonly get deposited onto the semiconductor substrates that are being processed. Another source for particle contamination is the exposure of components in a gas delivery system to room air during maintenance and repair or replacement of individual gas delivery system components.

Accordingly, disclosed herein is a monolithic ceramic component of a gas delivery system and a method of making a monolithic ceramic component of a gas delivery system wherein the monolithic ceramic component is corrosion, erosion, and corrosion/erosion resistant such that metal contamination of a semiconductor substrate is reduced during semiconductor substrate processing. The monolithic ceramic component preferably includes conduits therein through which process gas can flow. As the term is used herein, a conduit can refer to a channel, tube, routing port, pipe, or the like that permits gaseous or fluid communication between at least two locations of the component. Preferably, one or more vertical, diagonal, and/or horizontal conduits are disposed in the monolithic ceramic component, and one or more inlet ports and one or more outlet ports are formed in the monolithic ceramic component. Further, the method of making the monolithic ceramic component allows for larger components to be formed, with fewer constituent components wherein the components have a desired conduit path therein for process gas to flow therethrough, than what was available in the prior art. For example, prior art gas delivery system components were made from metals such as stainless steel wherein constituent components had to be assembled together, requiring interfaces and seals between the constituent components, in order to achieve a desired conduit path for process gas to flow therethrough due to the tolerances of machining the prior art metal constituent components and further due to the desire to coat the process wetted surfaces forming the conduits of the prior art constituent components with a protective coating. However, since the monolithic ceramic component is formed from a green compact of ceramic material and then fired, there is no need for constituent components to be assembled together to achieve the desired conduit path therein, nor is there a need for interfaces and seals between constituent components, thus allowing for larger components to be formed. Furthermore, the process wetted surfaces forming the conduits of the components are corrosion, erosion, and corrosion/erosion resistant without needing a protective coating thereon.

The ceramic material forming the monolithic ceramic gas delivery can be high purity silicon, silicon carbide (SiC), silicon oxide, silicon nitride, boron carbide, aluminum nitride, titanium oxide, alumina, zirconia, beryllia, or ceria. Preferably the ceramic material forming the monolithic ceramic component of the gas delivery system is selected from the group consisting of oxide material, nitride material, boride material, fluoride material, and carbide material. By use of ceramic as the material of the monolithic ceramic component of the gas delivery system allows the components to be highly resistant to chemical sputtering (for example, sputtered SiC forms Si and C which may not affect device performance) and corrosion, erosion, and/or corrosion/erosion in environments that may contain oxygen, halogens, and/or hydro-fluorocarbon process gas, or process gases which may be used in semiconductor substrate processing such as but not limited $Cl_2$, $HCl$, $BCl_3$, $Br$, $HBr$, $O_2$, $SO_2$, $CF_4$, $CH_2F_2$, $NF_3$, $CH_3F$, $CHF_3$, and $SF_6$ in order to avoid corrosion and/or breakdown, and resultant particle generation associated therewith.

FIG. 1 illustrates an embodiment of a semiconductor substrate processing apparatus which can include a gas delivery system 234 including a monolithic ceramic component as disclosed herein. As shown in FIG. 1, an inductively coupled plasma processing apparatus can include a vacuum chamber 200 (i.e. plasma etch chamber). The vacuum chamber 200 includes a substrate support (lower electrode assembly) 215 for supporting a semiconductor substrate 214 in the interior of the vacuum chamber 200. A dielectric window 20 forms a top wall of vacuum chamber 200. Process gases are injected to the interior of the vacuum chamber 200 through a gas injector 22. The gas delivery system 234 supplies process gases to the interior of the vacuum chamber 200 through gas injector 22. Parameters (e.g., temperature, flow rate, and chemical makeup) of the process gases supplied to the interior of the vacuum chamber by the gas delivery system are preferably controlled by a control system 385.

Once process gases are introduced into the interior of vacuum chamber 200, they are energized into a plasma state by an antenna 18 supplying energy into the interior of vacuum chamber 200. Preferably, the antenna 18 is an external planar antenna powered by a RF power source 240 and RF impedance matching circuitry 238 to inductively couple RF energy into vacuum chamber 200. However, in an alternate embodiment, the antenna 18 may be an external or embedded antenna which is nonplanar. An electromagnetic field generated by the application of RF power to planar antenna energizes the process gas in the interior of the vacuum chamber 200 to form high-density plasma (e.g., $10^9$-$10^{12}$ ions/cm$^3$) above substrate 214. During an etching process, the antenna 18 (i.e. a RF coil) performs a function analogous to that of a primary coil in a transformer, while the plasma generated in the vacuum chamber 200 performs a function analogous to that of a secondary coil in the transformer. Preferably, the antenna 18 is electrically connected to the RF impedance matching circuitry 238 by an electrical connector 238*b* (i.e. lead) and the RF power source 240 is electrically connected to the RF impedance matching circuitry 238 by an electrical connector 240*b*.

Figure 2:
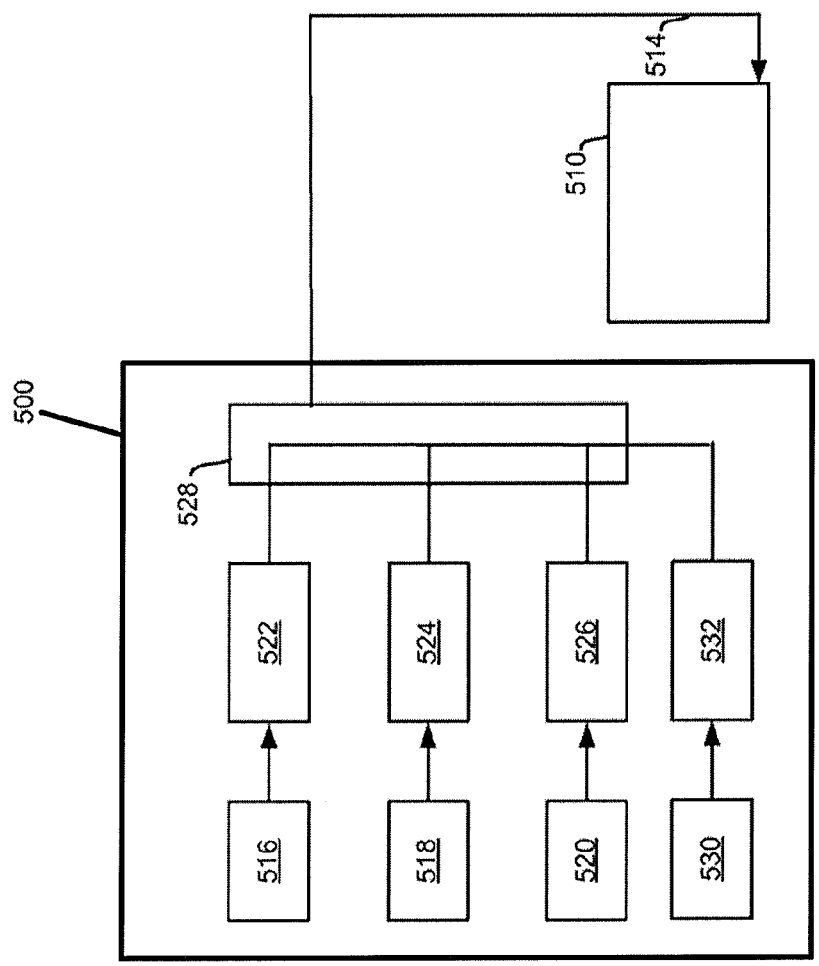
FIG. 2 is a schematic of a gas delivery system in accordance with embodiments disclosed herein.

FIG. 2 is a schematic view of an exemplary gas delivery system 500 for a semiconductor substrate processing apparatus processing. A vacuum chamber 510 of a semiconductor substrate processing apparatus is supplied process gas through a gas supply line 514. The gas supply line 512 can provide process gases to a gas distribution member such as a showerhead or a gas injector arranged in the upper portion of the vacuum chamber 510, and downstream of the gas delivery system 500. Additionally, gas supply line 514 may supply process gas to a lower portion of the vacuum chamber such as, for example, to a gas distribution ring surrounding the semiconductor substrate support or through gas outlets arranged in the substrate support. Processing gas may be supplied to gas line 514 from gas supplies 516, 518, 520, 530 with the process gases from supplies 516, 518, 520, 530 being supplied to MFCs 522, 524, 526, 532 respectively. The MFCs 522, 524, 526, 532 supply the process gases to a mixing manifold 528 after which the mixed gas is directed to gas flow line 514. The gas delivery system 500 preferably has one or more monolithic ceramic components. For example, the manifold 528 is preferably a monolithic ceramic component of the gas delivery system 500.

Figure 3:
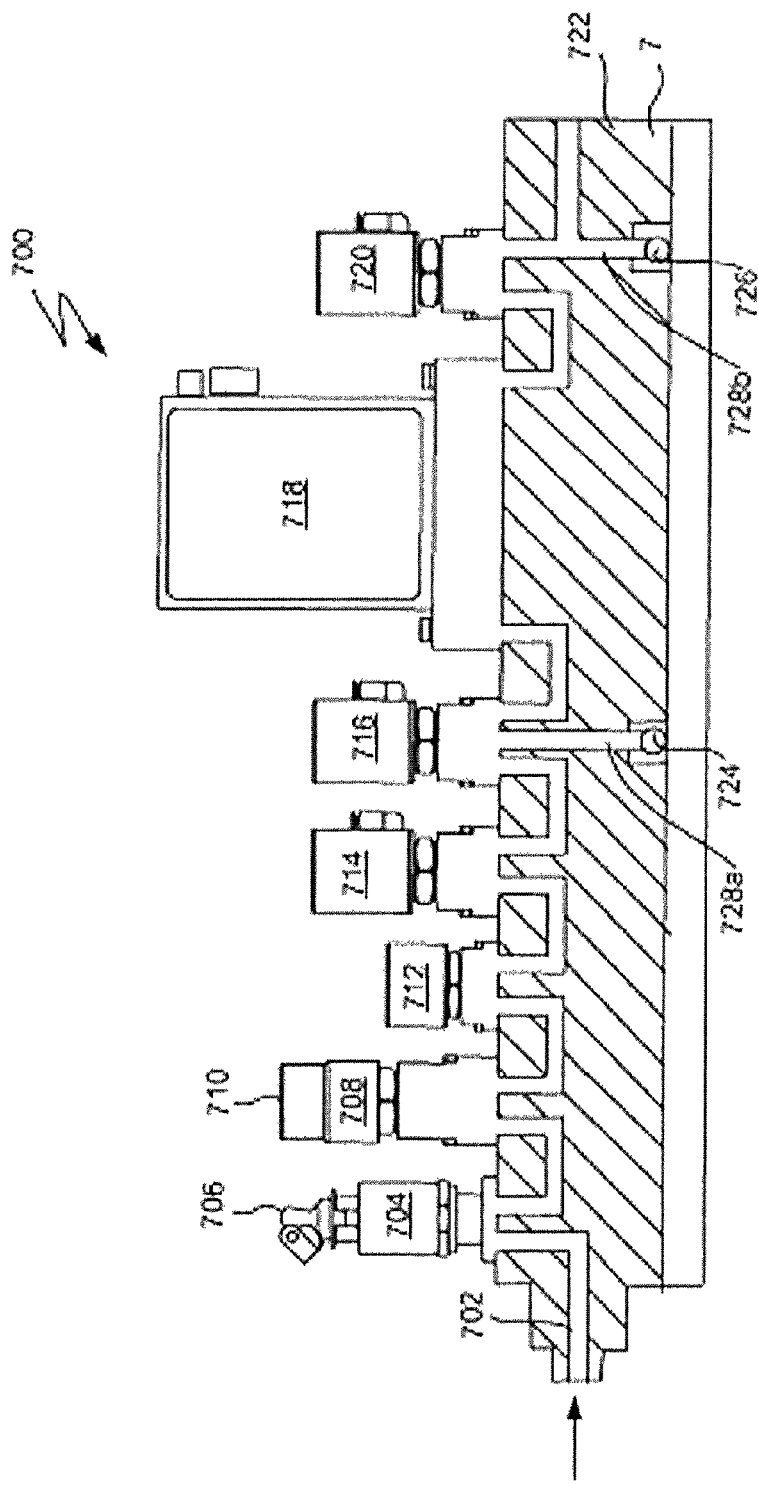
FIG. 3 illustrates an embodiment of a gas stick which can include a monolithic ceramic component in accordance with embodiments disclosed herein.

FIG. 3 illustrates a cross section of a gas stick 700 which can include a monolithic ceramic component and which may be included in a gas delivery system as disclosed herein. Although the gas stick is illustrated with certain components, the specific components are not intended to be limiting as different components may be used and/or less or more components may be used to form the gas stick. Additionally, although described with a single gas stick, the number of gas sticks is not intended to be limiting. As discussed above, a plurality of gas sticks, form a gas box or panel. In an embodiment, each valve on the components can be an integrated surface mount valve. In general, an integrated surface mount component is a gas control component (e.g., valve, filter, etc.) that is connected to other gas control components through channels (e.g. conduits) on a mount assembly, upon which the gas control components are mounted.

The gas stick 700 may have a gas stick input port 702 to input a supply gas. A manual valve 704 may be used for carrying out the supply or isolation of the supply of supply gas. The manual valve 704 may also have a lockout/tagout device 706 above it. Worker safety regulations often mandate that plasma processing manufacturing equipment include activation prevention capability, such as a lockout/tagout mechanism. Generally a lockout is a device that uses positive means such as a lock, either key or combination type, to hold an energy-isolating device in a safe position. A tagout device is generally any prominent warning device, such as a tag and a means of attachment that can be securely fastened to energy-isolating device in accordance with an established procedure.

A regulator 708 may be used to regulate the gas pressure of the process gas and a pressure gauge 710 may be used to monitor the pressure of the process gas. In one embodiment, the pressure may be preset and not need to be regulated. In another embodiment, a pressure transducer (not illustrated) having a display to display the pressure may be used. The pressure transducer may be positioned next to the regulator 708. A filter 712 may be used to remove impurities in the process gas. A primary shut-off valve 714 may be used to prevent any corrosive supply gasses from remaining in the gas stick. The primary shut-off valve 714 may be two-port valve having an automatic pneumatically operated valve assembly that causes the valve to become deactivated (closed), which in turn effectively stops plasma gas flow within the gas stick. Once deactivated, a non-corrosive purge gas, such as nitrogen, may be used to purge the gas stick. The purge valve 716 may have three-ports to provide for the purge process—an entrance port, an exit port and a discharge port.

Adjacent the purge valve 716 may be a mass flow controller ("MFC") 718. The MFC 718 accurately measures the flow rate of the process gas. Positioning the purge valve 716 next to the MFC 718 allows a user to purge any corrosive process gasses in the MFC 718. A mixing valve 720 next to the MFC 718 may be used to control the amount of process gas to be mixed with other process gases on the gas panel.

Each component of the gas stick is preferably positioned above a ceramic mixing manifold. A plurality of manifold blocks can form the mixing manifold 722, or preferably, the mixing manifold 722 is a monolithic ceramic mixing manifold 722 that creates the flow path of gas through the gas stick 700. Additional gas delivery system components may be positioned on the manifold blocks by any known means such as with a pressure fitting sealant (eg., C-seal) and the like.

In order to make the monolithic ceramic component, a green compact of ceramic material is first prepared. Preferably the green compact of ceramic material is formed from a slurry comprising at least one ceramic material. In an embodiment, the green compact of ceramic material can be formed by pressing a mixture of ceramic powder, a binder, and liquid into the green compact. The green compact of ceramic material can be formed in the shape of any gas delivery system component. Details of ceramic processing techniques are given in Introduction to Ceramics, $2^{nd}$ Edition, by W. D. Kingery, H. K. Bowen, and D. R. Uhlmann (J. Wiley & Sons, 1976). This description is incorporated herein by reference in its entirety. An exemplary embodiment of forming a ceramic component from a green compact of ceramic material can be found in commonly-assigned U.S. Pat. No. 6,780,787 which is incorporated by reference herein in its entirety. An exemplary embodiment of forming a ceramic component of silicon nitride can be found in commonly-assigned U.S. Pat. No. 8,622,021 which is incorporated by reference herein in its entirety.

The green compact of ceramic material is formed into a form of a desired monolithic ceramic component of the gas delivery system. The formed green compact of ceramic material is then fired to form the monolithic ceramic component of the gas delivery system, wherein the firing is preferably performed by sintering the formed green compact of ceramic material. The formed green compact preferably includes one or more conduits formed therein, such that process gas can flow through the conduits after the green compact is fired, the monolithic ceramic component is formed, and the monolithic ceramic component is assembled in the gas delivery system. The one or more conduits may be formed by punching holes in the formed green compact. Preferably, the one or more conduits are vertical, diagonal, and/or horizontal conduits which are disposed in the monolithic ceramic component. Further, one or more inlet ports and one or more outlet ports are formed in the monolithic ceramic component. In an alternate embodiment, the green compact of ceramic material is formed into the form of the desired monolithic ceramic component of the gas delivery system by layering individual layers of the green compact of ceramic material over one another wherein each layer is each patterned to correspond to a layer of desired monolithic ceramic component. In this manner, the patterned layers of the green compact of ceramic material can be arranged such that the formed green compact of ceramic material corresponds to the form of a desired monolithic ceramic component, including one or more conduits, which may be horizontal, vertical, and/or diagonal, wherein the one or more conduits thin a desired conduit path in the interior of the monolithic ceramic component for process gas to flow therethrough. Preferably one or more inlet ports and one or more outlet ports are formed in the green compact of ceramic material such that the one or more inlet ports and outlet ports correspond to the form of a desired monolithic ceramic component, wherein the one or more inlet ports and the one or more outlet ports are in fluid communication with the one or more conduits. The inlet ports are preferably configured to receive process gas therethrough, and the outlet ports are preferably configured such that process gas can be supplied to a downstream component of the semiconductor substrate processing apparatus.

In an alternate embodiment, the green compact of ceramic material can be formed around a carbon containing preform, or a polymer preform, wherein the preform is formed into a form corresponding to an internal cavity structure (i.e. the desired conduit path in the interior of the monolithic ceramic component) of the desired component. The preform can be later removed from the interior of the formed green compact of ceramic material, by heating the preform, thereby facilitating the removal of the preform from the formed green compact of ceramic material. Alternatively, the preform can be removed during or after firing the formed green compact of ceramic material. An exemplary embodiment of forming and removing a preform from the interior of a ceramic component can be found in commonly-assigned U.S. patent application Ser. No. 13/766,096 which is incorporated by reference herein in its entirety.

In an embodiment of the method of making a monolithic ceramic component of a gas delivery system of a semiconductor substrate processing apparatus, a green compact of ceramic material can be formed. The green compact of ceramic material is preferably layered, layer by layer, by layering individual layers of green compact of ceramic material to form a green compact of ceramic material which corresponds to a form of a desired monolithic ceramic component of the gas delivery system. Each layer of the green compact of ceramic material is preferably patterned such that one or more conduits for supplying process gas therethrough is disposed in the formed green compact of ceramic material after each layer has been formed. Preferably, each layer of the green compact of ceramic material is fired as it is layered into the desired form of the monolithic ceramic component of the gas delivery system to form the monolithic ceramic component of the gas delivery system. A non-transitory computer machine-readable medium preferably comprises program instructions for performing the method of making the monolithic ceramic component. The program instructions preferably include the pattern for each layer of the green compact of ceramic material to be layered thereby forming the desired form of the monolithic ceramic component. In an embodiment, each layer of the green compact of ceramic material can be 3-D printed into the desired form of the monolithic ceramic component. In this embodiment, the non-transitory computer machine-readable medium preferably comprises program instructions including the pattern for each layer of the green compact of ceramic material to be layered as well as the recipe for firing the green compact of ceramic material to form the monolithic ceramic component. Preferably, the firing of the formed green compact of the ceramic material is performed by sintering the formed green compact of ceramic material as each layer is layered. The monolithic ceramic component is preferably then installed in a gas delivery system of the semiconductor substrate processing apparatus.

Preferably the monolithic ceramic component is a component of a gas stick, a manifold, a gas pallet, or a flow adaptor block of the gas delivery system. An exemplary embodiment of a flow adaptor block can be found in commonly-assigned U.S. Pat. No. 8,322,380 which is incorporated by reference herein in its entirety. The flow adaptor block can preferably include one or more horizontal or vertical conduits therein which are in fluid communication with one or more inlet ports or outlets ports thereof. An exemplary embodiment of a gas stick and mixing manifold can be found in commonly-assigned U.S. Patent Application No. 2010/0326554 which is incorporated by reference herein in its entirety. The mixing manifold can preferably include one or more horizontal or vertical conduits therein which are in fluid communication with one or more inlet ports or outlets ports thereof. For example, a monolithic ceramic mixing manifold can be formed to support gas delivery components of a gas stick. Preferably each of the gas delivery components of the gas stick are supported on an upper surface of a support element (i.e. gas pallet) which includes inlet ports for receiving the respective gas delivery components wherein the inlet ports are in fluid communication with interconnected conduit paths disposed therebelow. Preferably vertical conduits of the interconnected conduit paths of the support element lead to a horizontal common manifold pathway and of the support element.

A semiconductor substrate can be processed in a semiconductor substrate in a semiconductor substrate processing apparatus including the gas delivery system which includes a monolithic ceramic component as disclosed herein. Preferably the semiconductor substrate is processed by supplying process gas from the gas delivery system to a vacuum chamber of the processing apparatus. The process gas is introduced into a processing region of the vacuum chamber of the processing apparatus. The semiconductor substrate is then processed with the process gas. Preferably the method of processing the semiconductor substrate includes deposition of conductive or dielectric material on the semiconductor substrate. Alternatively, in a preferred embodiment, the method of processing the semiconductor substrate includes plasma etching a layer on the semiconductor substrate wherein the layer is metal, dielectric, or photoresist.

While embodiments disclosed herein have been described in detail with reference to specific embodiments thereof, it will be apparent to those skilled in the art that various changes and modifications can be made, and equivalents employed, without departing from the scope of the appended claims.

What is claimed is:

1. A method of making a monolithic ceramic a gas stick usable in a gas delivery system of a semiconductor substrate processing apparatus, the method of making the monolithic ceramic component comprising:
preparing a green compact of ceramic material;
forming the green compact of ceramic material into a form of a desired monolithic ceramic gas stick having a plurality of inlet ports and a plurality of outlet ports and one or more conduits in fluid communication with the inlet and outlet ports, wherein the green compact of ceramic material is formed around a preform having a shape corresponding to an internal cavity structure of the monolithic ceramic gas stick;
removing the preform from the formed green compact of ceramic material by heating the preform to thereby facilitate removal of the preform from the formed green compact of ceramic material; and
firing the formed green compact of ceramic material to form the monolithic ceramic gas stick of the gas delivery system.

2. The method of claim 1, wherein the firing of the formed green compact of the ceramic material is performed by sintering the formed green compact.

3. The method of claim 1, wherein the one or more conduits are a plurality of vertical conduits, optional diagonal conduits, and a plurality of horizontal conduits.

4. The method of claim 1, wherein the green compact of ceramic material is formed from a slurry comprising at least one powder of a ceramic material and a binder.

5. The method of claim 1, wherein the ceramic material is selected from the group consisting of silicon, silicon carbide (SiC), silicon oxide, silicon nitride, boron carbide, aluminum nitride, titanium oxide, alumina, zirconia, beryllia, and ceria.

6. A method of making a monolithic ceramic mixing manifold of a gas delivery system of a semiconductor substrate processing apparatus, the method comprising:
preparing layers of a green compact of ceramic material;
over layering the green compact of ceramic material layer by layer to form a green compact of ceramic material which corresponds to a form of a desired monolithic ceramic mixing manifold configured to support gas delivery components of a gas stick, the mixing manifold having one or more inlet and outlet ports and one or more conduits in fluid communication with the inlet and outlet ports, wherein each layer of the green compact of ceramic material is patterned such that a plurality of vertical conduits, optional diagonal conduits, and a plurality of horizontal conduits are formed in the formed green compact of ceramic material; and
firing the green compact of ceramic material to form the monolithic ceramic mixing manifold.

7. The method of claim 6, wherein the firing of the formed green compact of the ceramic material is performed by sintering the formed green compact of ceramic material as each layer is layered.

8. The method of claim 6, wherein the green compact of ceramic material is formed from a slurry comprising at least one powder of a ceramic material and a binder and the layers are formed by 3-D printing the slurry.

9. The method of claim 6, wherein the ceramic material is selected from the group consisting of silicon, silicon carbide (SiC), silicon oxide, silicon nitride, boron carbide, aluminum nitride, titanium oxide, alumina, zirconia, beryllia, and ceria.

* * * * *